United States Patent
Ishii et al.

(10) Patent No.: US 8,027,528 B2
(45) Date of Patent: Sep. 27, 2011

(54) METHOD FOR CALCULATING HEIGHT OF CHUCK TOP AND PROGRAM STORAGE MEDIUM FOR STORING SAME METHOD

(75) Inventors: Kazunari Ishii, Nirasaki (JP); Masaru Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 879 days.

(21) Appl. No.: 12/034,182

(22) Filed: Feb. 20, 2008

(65) Prior Publication Data

US 2008/0198176 A1 Aug. 21, 2008

(30) Foreign Application Priority Data

Feb. 21, 2007 (JP) .................................. 2007-040311

(51) Int. Cl.
*G06K 9/00* (2006.01)

(52) U.S. Cl. ........ 382/141; 382/144; 382/152; 438/401; 438/462; 438/800; 700/96; 700/105; 700/121; 356/237.4; 356/394

(58) Field of Classification Search .......... 382/144–152, 382/141, 203, 206, 286, 291, 293; 438/16, 438/401, 462, 800; 430/4, 5, 30; 356/237.4, 356/237.5, 394

See application file for complete search history.

(56) References Cited

U.S. PATENT DOCUMENTS

| 6,813,000 B1 * | 11/2004 | Nishi | 356/401 |
| 2009/0053629 A1 * | 2/2009 | Shibazaki et al. | 430/30 |

* cited by examiner

*Primary Examiner* — Gregory J Toatley
*Assistant Examiner* — Iyabo S Alli
(74) *Attorney, Agent, or Firm* — Oblon, Spivak, McClelland, Maier & Neustadt, L.L.P.

(57) ABSTRACT

A method is for calculating a height of a chuck top. A height of the top surface of the chuck top which corresponds to an arbitrary position specified on the XY coordinate plane by a computer is calculated in each of the four quadrants based on a coordinate transformation formulas. The method includes setting, by using the computer, a conical model in which two adjacent points other than the center point of the chuck top which correspond to the specified coordinates in a predetermined quadrant of the XY coordinate plane are obtained on a circumference having the center point of the chuck top as the origin and specifying an arbitrary point in the predetermined quadrant by using the computer and calculating a height of the arbitrary point of the chuck top based on the conical model, the coordinate transformation formulas and the specified coordinates.

8 Claims, 4 Drawing Sheets

METHOD FOR CALCULATING HEIGHT OF CHUCK TOP AND PROGRAM STORAGE MEDIUM FOR STORING SAME METHOD

FIELD OF THE INVENTION

The present invention relates to a method for calculating a height of a chuck top so that a uniform overdrive can be constantly applied thereto when making electrical contact between an target object and a plurality of probes of a probe card; and, more particularly, to a method for calculating a height of a chuck top based on calculation of a height of an arbitrary point of a chuck top with high precision and a program storage medium for storing same method.

BACKGROUND OF THE INVENTION

When electrical characteristics of a target object, e.g., a semiconductor wafer, are inspected, there is used a probe device for directly inspecting the semiconductor wafer. Such a probe device includes: a vertically movable wafer chuck provided in an inspection chamber, on which the semiconductor wafer is mounted; an XY stage for moving the wafer chuck in X and Y directions; a probe card disposed above the XY stage; and an alignment mechanism for aligning the semiconductor wafer on a the wafer chuck with a plurality of probes of the probe card. The probe device performs the electrical characteristic inspection while electrically contacting chips of the semiconductor wafer and the probes by overdriving the aligned semiconductor wafer. The alignment mechanism has, e.g., a lower camera attached to the wafer chuck and an upper camera, attached to an alignment bridge, capable of moving to a portion just below the probe card.

When electrodes in the chips and the probes are brought into electrical contact with each other, a chuck top is controlled so that a uniform overdrive can be applied to all the chips. However, it is difficult to apply a uniform overdrive due to manufacturing errors of the wafer chuck or the like. Therefore, a height of the chuck top is calculated by measuring heights of five points including a center point of a semiconductor wafer surface on the chuck top and right, left, upper and lower points thereof and calculating an average value for contact positions (contact coordinates) in four quadrants obtained by dividing the semiconductor wafer surface while setting a height of the center point as the origin. Since the semiconductor wafer is vacuum-attracted on the chuck top, the semiconductor wafer surface on the chuck top can be treated as a plane along a top surface of the chuck top.

Figure 4A:
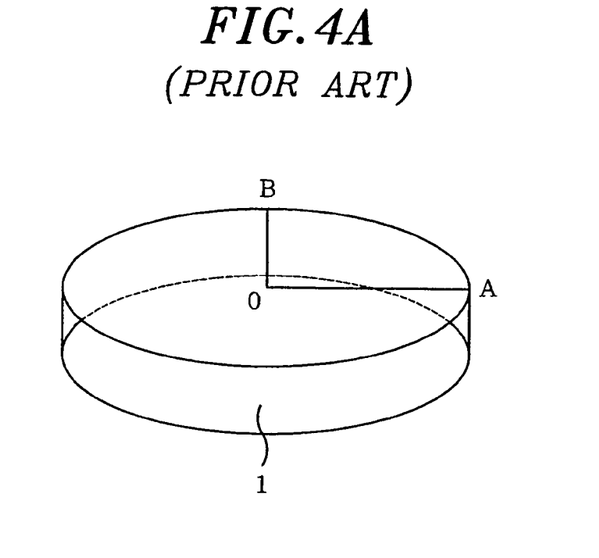
FIGS. 4A and 4B represent explanatory diagrams for explaining a principal of the conventional method for calculating a height of a chuck top.
Figure 4B:
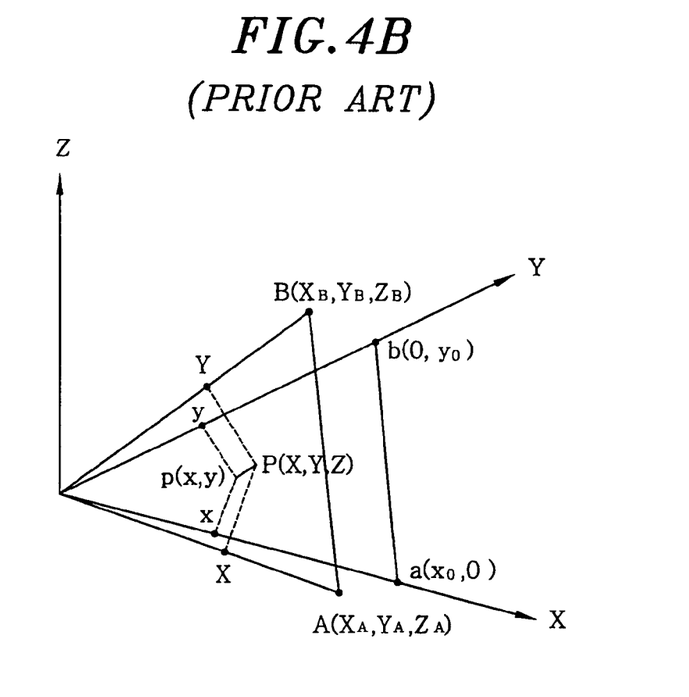

Therefore, it is crucial to measure the height of the chuck top with high precision. For example, FIGS. 4A and 4B show a principal of a conventional method for calculating a height of a chuck top in a first quadrant on a top surface of the chuck. Heights of the chuck top in a second to a fourth quadrant can also be obtained in the same sequence applied in the first quadrant.

In the conventional method, XY coordinates of three points for defining XY coordinates in the first quadrant of the chuck top are specified on an XY coordinate plane of a computer (hereinafter, referred to as "ideal coordinate plane"). Based on these specified coordinates, three points on the chuck top 1 are required as shown in FIGS. 4A and 4B. As for the top surface of the first quadrant of the chuck top 1, there is set a planar model, e.g., a plane OAB formed by a center point O of the chuck top 1 and straight lines OA and OB perpendicular to each other at the center point O as shown in FIG. 4A. Further, the origin O on the ideal coordinate plane specified by the computer coincides with the center point O of the chuck top 1, and a plane including the center point O, point a in X axis and point b in Y axis on the ideal coordinate plane is defined as a plane Oab. Points A and B on the chuck top 1, which are coordinates of an actual chuck top 1 including heights thereof, are obtained in correspondence to the points a and b specified on the ideal coordinate plane. FIG. 4B depicts a relationship between the plane OAB formed of those three points on the chuck top 1 and the plane Oab on the ideal coordinate plane.

As can be seen from FIG. 4B, when the point a $(x_o, O)$ in the X axis and the point b $(O, y_o)$ in the Y axis on the ideal coordinate plane are specified by the computer, the specified positions of the chuck top 1, which correspond to the points a and b, are led directly under the position where the height of chuck top 1 is detected. Heights of the chuck top 1 in those positions are measured, and coordinates of the points A and B corresponding to the points a and b can be obtained based on the moving distance of the chuck top 1 at this time.

Following coordinate transformation formulas are used for calculating arbitrary coordinates specified on the ideal coordinate plane and heights of the chuck top 1 which correspond thereto. In the coordinate transformation formulas, contact coordinates X and Y are obtained as a function of specified coordinates x and y, and a coordinate Z is obtained as a function of the coordinates X and Y. Moreover, in the following coordinate transformation formulas, one point on the plane Oab of the ideal coordinate plane is defined as a point p (x, y), and one point on the plane OAB of the chuck top 1 which correspond to the point p is defined as a point P (X, Y, Z).

$$X = ax + by$$

$$Y = cx + dy$$

$$Z = eX + fY$$

Each of the coefficients in the coordinate transformation formulas is calculated by substituting the specified coordinates on the ideal coordinate plane and the measurement values of the chuck top 1 which correspond thereto. After the calculation of the coefficients, arbitrary contact coordinates x and y are specified by the computer and the coordinates are substituted to the coordinate transformation formulas in the computer. As a result, the contact coordinates X and Y of the chuck top 1 which correspond to the specified contact coordinates are obtained, and the contact coordinate Z, i.e., the height Z of the chuck top 1, is calculated based on the coordinates X and Y.

$$a = X_A / x_O$$

$$b = X_B / y_O$$

$$c = Y_A / x_O$$

$$d = Y_B / y_O$$

$$e = (Y_B * Z_A - Y_A * Z_B) / (X_A * Y_B - X_B * Y_A)$$

$$f = --(X_B * Z_A - X_A * Z_B) / (X_A * Y_B - X_B * Y_A)$$

Japanese Patent Publication No. H07-105414 discloses therein a technique for making an electrical contact between a semiconductor wafer and a probe under a uniform pressure. Further, Japanese Patent No. 2986141 discloses therein a technique capable of performing alignment between chips and probes with high precision.

However, in the conventional method for calculating a height of a chuck top, it is assumed that the top surface of the chuck top 1 is a plane on the computer. With this assumption, a height of the chuck top 1 is obtained, on average, based on the specified coordinates x and y. Therefore, as the contact positions of the probes keep away from the measured points, the difference between the actual height of the chuck top 1 and the contact coordinate Z calculated based on the measured points increases. Accordingly, a variation in the contact positions increases, and especially a variation in a direction of 45° with respect to the straight lines OA and OB increases to the most. As a result, even if the chuck top 1 is overdriven in that portion, the reliability of the inspection is not ensured.

SUMMARY OF THE INVENTION

In view of the above, the present invention provides a method for calculating a height of a chuck top so that a uniform overdrive can be applied constantly thereto by reducing a deviation in heights of the chuck top which are corrected based on actually measured heights in several points of the chuck top, and a program storage medium for storing same method.

As a result of measuring a state of the top surface of the chuck top by using a measuring device such as a PEACOCK (trademark) or the like with high precision, the present inventors have found that the top surface of the chuck top is not a plane, but is approximately a conical shape having a lowest portion at the center point of the chuck top and a height gradually increasing toward an outer periphery.

In accordance with a first aspect of the invention, there is provided a method for calculating a height of a chuck top, wherein when electrical characteristics of a target object mounted on the chuck top of a probe device are inspected, XY coordinates of at least five points including a center point of a top surface of the chuck top and right, left, upper and lower points thereof are specified by a computer on an XY coordinate plane on the computer; heights of the chuck top which correspond to the specified coordinates are measured sequentially; coordinate transformation formulas for converting the XY coordinates to coordinates including the heights of the top surface of the chuck top are obtained for four quadrants of the XY coordinate plane respectively, and a height of the top surface of the chuck top which correspond to an arbitrary position specified on the XY coordinate plane by the computer is calculated in each of the four quadrants based on the coordinate transformation formulas.

The method includes setting, by using the computer, a conical model in which two adjacent points other than the center point of the chuck top which correspond to the specified coordinates in a predetermined quadrant of the XY coordinate plane are obtained on a circumference having the center point of the chuck top as the origin and specifying an arbitrary point in the predetermined quadrant by using the computer and calculating a height of the arbitrary point of the chuck top based on the conical model, the coordinate transformation formulas and the specified coordinates.

In accordance with a second aspect of the present invention, there is provided a method for calculating a height of a chuck top, wherein when electrical characteristics of a target object mounted on the chuck top of a probe device are inspected, XY coordinates of at least five points including a center point of a top surface of the chuck top and right, left, upper and lower points thereof are specified by a computer on an XY coordinate plane on the computer; heights of the chuck top which correspond to the specified coordinates are measured sequentially; coordinate transformation formulas for converting the XY coordinates to coordinates including the heights of the top surface of the chuck top are obtained for four quadrants of the XY coordinate plane respectively, and a height of the top surface of the chuck top which correspond to an arbitrary position specified on the XY coordinate plane by the computer is calculated in each of the four quadrants based on the coordinate transformation formulas.

The method includes setting, by using the computer, a conical model in which two adjacent points other than the center point of the chuck top which correspond to the specified coordinates in a predetermined quadrant of the XY coordinate plane are obtained on a circumference having the center point of the chuck top as the origin; specifying, by using the computer, an arbitrary point of the chuck top in the predetermined quadrant of the XY coordinate plane; calculating, by using the computer, X and Y coordinates on X and Y axis of the XY coordinate plane by rotating specified coordinates of the arbitrary point along the circumference; calculating, by using the computer, a height of the chuck top with respect to the X and Y coordinates based on the X and Y coordinates corresponding to the specified coordinates of the arbitrary point and the coordinate transformation formulas; calculating, by using the computer, a central angle formed by one of the two adjacent points and the arbitrary point relative to the center point of the chuck top; and calculating, by using the computer, a height of the arbitrary point based on a difference in heights of the two adjacent points and a ratio of the central angle to an angle formed by the X and Y axis.

Further, the coordinate transformation formulas include $X=ax+by$, $Y=cx+dy$ and $Z=eX+fY$, and coefficient of the coordinate transformation formulas are calculated based on specified coordinates of the three points in the predetermined quadrant and three points of the conical model which correspond to the specified coordinates.

In accordance with a third aspect of the present invention, there is provided a storage medium for storing as a program a method for calculating a height of a chuck top, wherein when electrical characteristics of a target object mounted on the chuck top of a probe device are inspected, XY coordinates of at least five points including a center point of a top surface of the chuck top and right, left, upper and lower points thereof are specified by a computer on an XY coordinate plane on the computer; heights of the chuck top which correspond to the specified coordinates are measured sequentially; coordinate transformation formulas for converting the XY coordinates to coordinates including the heights of the top surface of the chuck top are obtained for four quadrants of the XY coordinate plane respectively; and a height of the top surface of the chuck top which correspond to an arbitrary position specified on the XY coordinate plane by the computer is calculated in each of the four quadrants based on the coordinate transformation formulas.

Herein, the program drives the computer to set a conical model in which two adjacent points other than the center point of the chuck top which correspond to the specified coordinates in a predetermined quadrant of the XY coordinate plane are obtained on a circumference having with respect to the center point of the chuck top as the origin; and specify an arbitrary point in the predetermined quadrant and calculate a height of the arbitrary point of the chuck top based on the conical model, the coordinate transformation formulas and the specified coordinates.

In accordance with a fourth aspect of the present invention, there is provided a storage medium for storing as a program a method for calculating a height of a chuck top, wherein when electrical characteristics of a target object mounted on the chuck top of a probe device are inspected, XY coordinates of at least five points including a center point of a top surface of the chuck top and right, left, upper and lower points thereof are specified by a computer on an XY coordinate plane on the computer; heights of the chuck top which correspond to the specified coordinates are measured sequentially; coordinate transformation formulas for converting the XY coordinates to coordinates including the heights of the top surface of the chuck top are obtained for four quadrants of the XY coordinate plane respectively; and a height of the top surface of the chuck top which correspond to an arbitrary position specified on the XY coordinate plane by the computer is calculated in each of the four quadrants based on the coordinate transformation formulas.

The program drives the computer to set a conical model in which two adjacent points other than the center point of the chuck top which correspond to the specified coordinates in a predetermined quadrant of the XY coordinate plane are obtained on a circumference having the center point of the chuck top as the origin; to specify an arbitrary point of the chuck top in the predetermined quadrant of the XY coordinate plane; to calculate X and Y coordinates on X and Y axis of the XY coordinate plane by rotating specified coordinates of the arbitrary point along the circumference; to calculate a height of the chuck top with respect to the X and Y coordinates based on the X and Y coordinates corresponding to the specified coordinates of the arbitrary point and the coordinate transformation formulas; to calculate a central angle formed by one of the two adjacent points and the arbitrary one point relative to the center point of the chuck top; and to calculate a height of the arbitrary point based on a difference in heights of the two adjacent points and a ratio of the central angle to an angle formed by the X and Y axis.

The coordinate transformation formulas include $X=ax+by$, $Y=cx+dy$ and $Z=eX+fY$, and coefficient of the coordinate transformation formulas are calculated based on specified coordinates of the three points in the predetermined quadrant and three points of the conical model which correspond to the specified coordinates.

In accordance with the present invention, there can be provided a method for calculating a height of a chuck top so that a uniform overdrive can be applied constantly by reducing a variation in heights of the chuck top which are corrected based on actually measured heights in several points of the chuck top, and a program storage medium for storing same method.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENT

The embodiments of the present invention will be described with reference to FIGS. 1 to 3 which form a part hereof.

First of all, an exemplary probe device to which a method for calculating a height of a chuck top of the present invention is employed will be described with reference to FIG. 1. As illustrated in FIG. 1, a probe device 10 includes: a movable wafer chuck 11 for mounting thereon a target object, e.g., a semiconductor wafer with notches; a probe card 12 disposed above the wafer chuck 11; an alignment mechanism 13 for performing alignment between a plurality of probes 12A of the probe card 12 and the semiconductor wafer on the wafer chuck 11; a first and a second imaging unit (e.g., CCD camera) 14 and 15 forming the alignment mechanism 13; a display device having a display screen 16 for displaying thereon images captured by the first and the second CCD camera 14 and 15; and a computer 17 for controlling these components. After the alignment between the semiconductor wafer on the wafer chuck 11 and the probes 12A of the probe card 12 is performed by the alignment mechanism 13 under the control of the computer 17, the electrical characteristics of the semiconductor wafer are inspected by electrically contacting the probes 12A with the semiconductor wafer.

Figure 1:
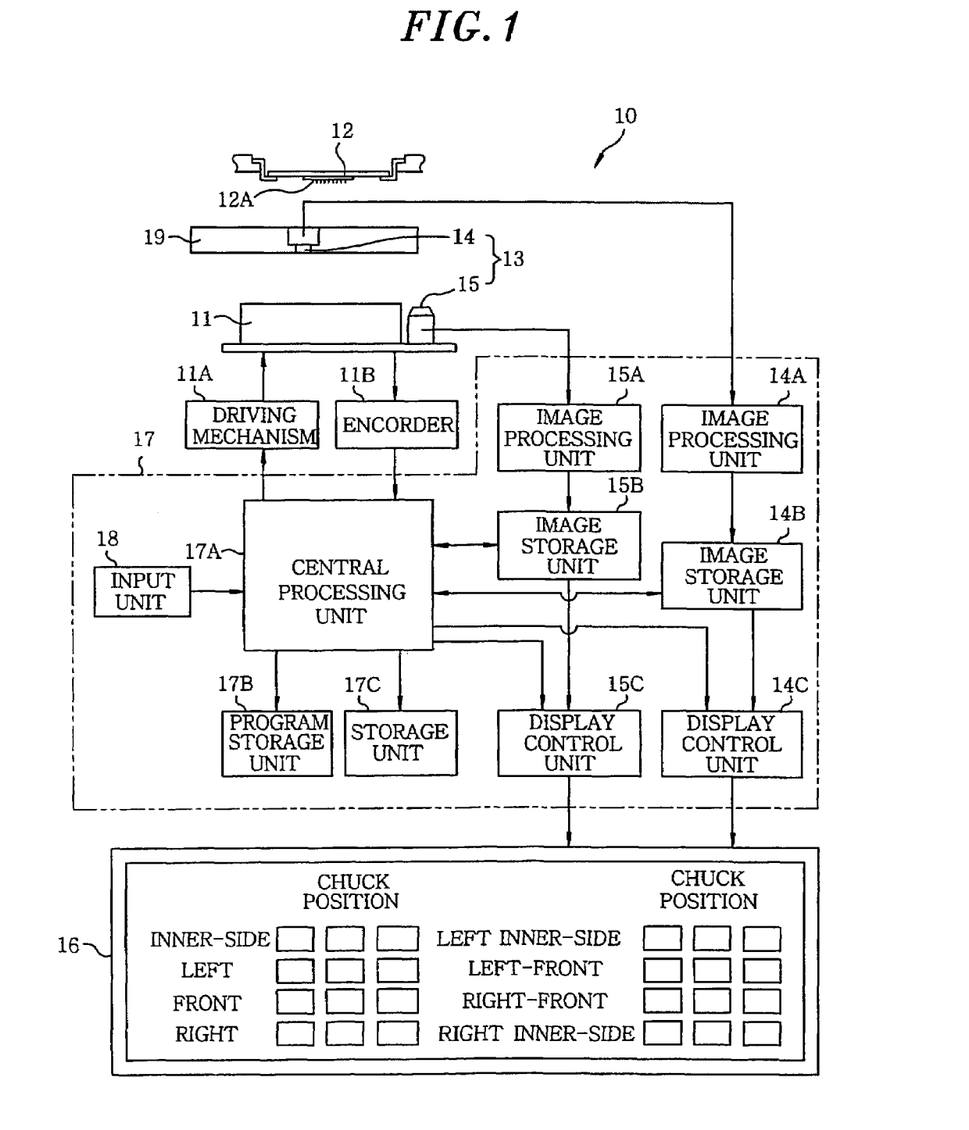
FIG. 1 is a block diagram illustrating principal parts of an exemplary probe device to which a method for calculating a height of a chuck top of the present invention is employed.
Figure 2A:
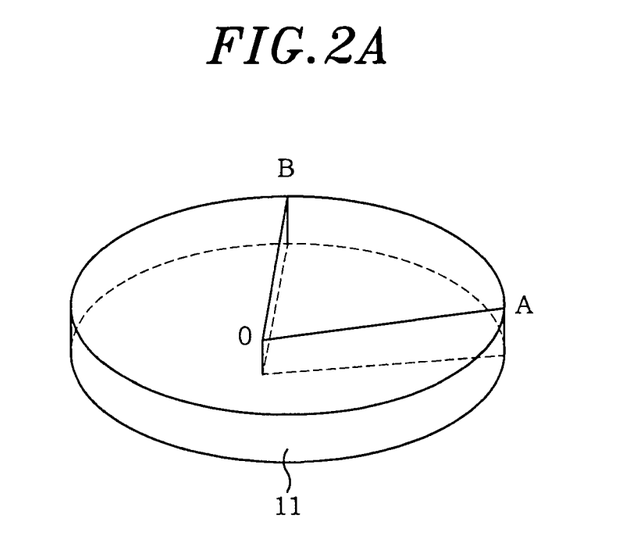
FIGS. 2A and 2B provide explanatory diagrams for explaining a principal of the method for calculating a height of a chuck top of the present invention.

In addition, the probe device 10 has an input unit 18 such as a keyboard or the like, as shown in FIG. 1. The input unit 18 allows various inspection conditions to be inputted and enables various programs or the like to be executed by specifying an icon (not shown) or a menu 16A displayed on the display screen 16.

As can be seen from FIG. 1, the wafer chuck 11 has a driving mechanism 11A and a detector (e.g., encoder) 11B. The wafer chuck 11 moves in X, Y, Z and θ directions via the driving mechanism 11A, and a moving distance thereof is detected via the encoder 11B. The driving mechanism 11A is provided with: a driving unit (not shown) mainly formed of a motor and a ball screw, for driving an XY table on which the wafer chuck 11 is disposed; an elevation driving unit installed in the wafer chuck 11; and a θ driving unit for rotating the wafer chuck 11 in a θ direction. The encoder 11B detects a moving distance of the XY table in X and Y directions through number of revolutions of the motor, and transmits the detection signals to the computer 17. The computer 17 controls the driving mechanism 11A based on the signals from the encoder 11B so that the moving distance of the wafer chuck 11 in the X and Y directions is controlled.

As set forth above, the alignment mechanism 13 includes the first and the second CCD camera 14 and 15 and an alignment bridge 19. The first CCD camera 14 is attached to the alignment bridge 19, and the second camera 15 is installed at a side portion of the wafer chuck 11, as shown in FIG. 1. The first and the second cameras 14 and 15 have two magnifications including a high magnification and a low magnification, and capture images of the probes 12A or the semiconductor wafer at a predetermined magnification.

The first CCD camera 14 moves from a rear portion of a prober chamber to a probe center through the alignment bridge 19, and is positioned between the probe card 12 and the wafer chuck 11. While the wafer chuck 11 is moving in X and Y directions, the first CCD camera 14 captures images of five points including a center point of the semiconductor wafer and right, left, upper and lower points thereof at a predetermined magnification according to instructions from the computer 17, and stores the respective positions in a storage unit 17C. Thereafter, the alignment bridge 19 returns to the rear portion of the prober chamber. While the wafer chuck 11 is moving in X and Y directions below the probe card 12, the second CCD camera 15 captures images of the probes 12A under the probe card 12 at a predetermined magnification, and stores heights of the probes 12A to the storage unit 17C.

The computer 17 includes: a central processing unit 17A; a program storage unit 17B for storing various programs including a program for executing a method for calculating a height of a chuck top in accordance with the present invention; the storage unit 17C for storing various data, image processing units 14A and 15A for image-processing photographing signals from the first and the second CCD cameras 14 and 15; image storage units 14B and 15B for storing image signals from the image processing units 14A and 15A as image data; and display control units 14C and 15C for displaying processed images of the central processing unit 17A on the display screen 16 according to the image signals. The central processing unit 17A controls the components of the probe device 10 by transmitting and receiving signals between the program storage unit 17B and the storage unit 17C.

The input unit 18 is connected to the central processing unit 17A, so that the central processing unit 17A processes various data signals inputted from the input unit 18 and stores the processed data in the storage unit 17C. In this embodiment, a program for executing a method for calculating a height of a chuck top of the present invention is stored in the program storage unit 17B. Therefore, the program can be executed by selecting it on the menu of the display screen 16. Besides, the method can be indicated as an icon instead of the menu. As illustrated in FIG. 1, the display screen 16 displays thereon measured heights of a center point of the wafer chuck 11 and four points adjacent thereto, i.e., inner-side (upper), left, front (lower), right points of the wafer chuck 11. In this embodiment, a center point of the wafer chuck 11 and eight points adjacent thereto are measured by using a PEACOCK (trademark), and measurement values thereof are inputted and displayed.

Moreover, the central processing unit 17A is connected with the image storage units 14B and 15B and the display control units 14C and 15C. The images captured by the first and the second CCD cameras 14 and 15 can be displayed on the display screen 16 via the central processing unit 17A and the display control units 14C and 15C. The image storage units 14B and 15B can store previously captured images or the like other than current images captured by the first and the second CCD camera 14 and 15.

The program for executing the method for calculating a height of a chuck top or other programs are stored in the program storage unit 17B via various storage mediums. Further, these programs can be downloaded to various probe devices by a communication media. In this embodiment, a program for detecting a center of a wafer which is stored in the program storage unit 17B is executed.

Hereinafter, a principal of the method for calculating a height of a chuck top in accordance with this embodiment will be described with reference to FIGS. 2 and 3. The method for calculating a height of a chuck top of this embodiment can be executed by the computer 17 driven by the program stored in the program storage unit 17B. The computer 17 is driven by that program. First of all, when the computer 17 is driven to specify five points including a center point of the wafer chuck 11 and right, left, upper and lower points thereof by using the ideal coordinate plane, specified points of the wafer chuck 11 which correspond to the five points are moved to portions just below the upper camera 14. Next, heights of the five points of the wafer chuck 11 are measured by the upper camera 14. Then, the height of the wafer chuck 11 is calculated based on the five points and specified coordinates of the ideal coordinate plane. Here, there will be described a method for calculating a height of the wafer chuck 11 at an arbitrary point in a first quadrant among four quadrants of the ideal coordinate plane, as shown in FIGS. 2 and 3. In FIGS. 2 and 3, the reference numeral 11 of the wafer chuck will be given to the chuck top.

Above all, as in the conventional method, the origin (O, O), a right point thereof a $(x_o, 0)$ and an upper point thereof b $(O, y_o)$ are specified on the ideal coordinate plane. At this time, the origin (O, O) on the ideal coordinate plane coincides with a center point of the chuck top 11. As described in FIG. 2B, the coordinates of the points A and B (see, FIG. 2A) on the chuck top 11, which correspond to the points a and b defining the first quadrant on the ideal coordinate plane, can be obtained as $(X_A, Y_A, Z_A)$ and $(X_B, Y_B, Z_B)$, respectively, based on the moving distance of the chuck top 11 as in the conventional method. In the conventional method, the height of the chuck top 11 is calculated by using a planar model in which all the contact coordinates exist on the plane OAB formed by the three points O, A and B. The three points O, A and B define the first quadrant of the chuck top 11. In the planar model, however, the variation in the overdrive amount is large, as described above.

Therefore, the present inventors have found, as a result of measuring a height of the chuck top 11 by using a measuring device such as a PEACOCK (trademark) or the like, that the top surface of the chuck top 11 is not a plane but is approximately a conical shape having a lowest portion at the center point of the chuck top and a height increasing toward an outer periphery. Hence, the present invention is characterized by calculating the height of the chuck top 11 with the use of a conical model instead of a planar model.

Figure 2B:
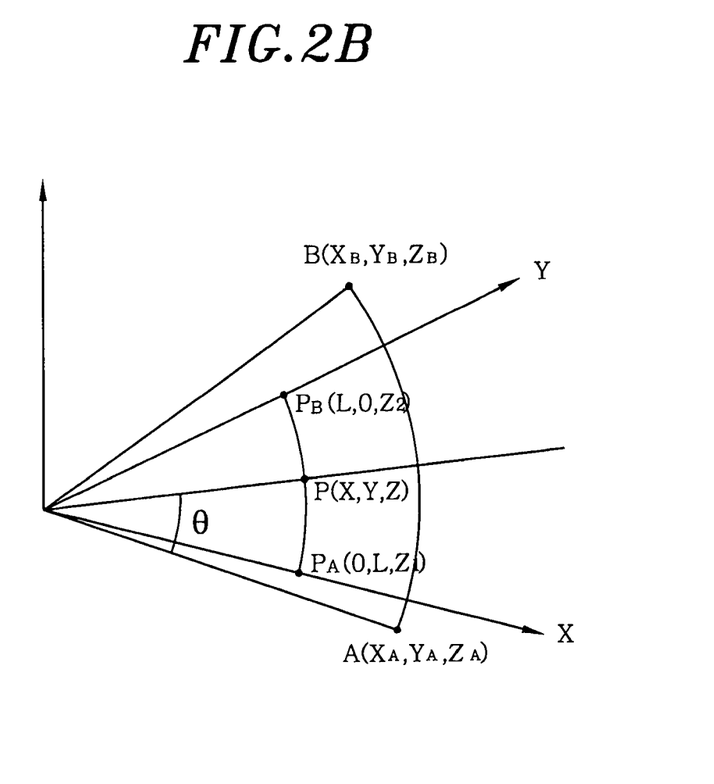

Specially, in this embodiment, it is considered that a height changes along a curved line formed by connecting the coordinates A $(X_A, Y_A, Z_A)$ and B $(X_B, Y_B, Z_B)$ with respect to the origin (O, O, O) in a conical shape, as depicted in FIG. 2B. If XY coordinates of an arbitrary point P are specified on the ideal coordinate plane, coordinates of a point P on the chuck top 11 which corresponds to the above point are obtained as (X, Y, Z). In a conical model, the point P is considered to be on a curved line (a curved line connecting a point $P_A$ and a point $P_B$) having a height that changes depending on a curved line passing the points A and B from the X axis to the Y axis with respect to the origin O.

The point $P_A$ is a point on the X axis which is obtained by rotating the point P to the X axis along the curved line AB with respect to the origin O while changing a height thereof, and has coordinates of $P_A$ (L, O, $Z_1$). Further, the point $P_B$ is a point on the Y axis which is obtained by rotating the point P to the Y axis along the curved line AB with respect to the origin O while changing a height thereof, and has coordinates of $P_B$ (O, L, $Z_2$). Here, L indicates a length of a straight line OP, and the length L is calculated by $\sqrt{(X^2+Y^2)}$ The heights of the points $P_A$ and $P_B$, i.e., the coordinates $Z_1$ and $Z_2$, can be calculated by using the coordinate transformation formulas based on specified coordinates of three points on the ideal coordinate plane and coordinates on the chuck top 11 which correspond to these points. Further, the height Z of the point P is calculated by following equation in which a difference between a height of the point $P_A$ and that of the point $P_B$ is multiplied by a ratio of an angle θ (see, FIG. 2B) formed by the straight line OP and the X axis to an angle (90°) formed by the X axis and the Y axis, and the value $(Z_2-Z_1)*(θ/90)$ is added to the height $Z_1$ of the point $P_A$. Here, the angle θ can be calculated by θ=tan⁻[absolute value of (Y/X)], based on the assumption that tan θ is equal to an absolute value of (Y/X).

$$Z=Z_1+(Z_2-Z_1)*(θ/90)$$

Here, the height of the chuck top 11 in the first quadrant has been calculated. The heights in the second to the fourth quadrant of the chuck top 11 can also be obtained in the same sequence.

Figure 3A:
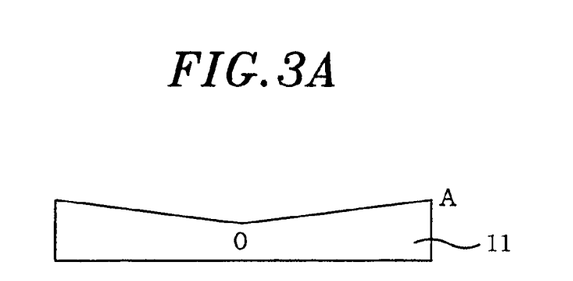
FIGS. 3A to 3C present explanatory diagrams for comparing the method for calculating a height of a chuck top of the present invention with a conventional method.
Figure 3B:
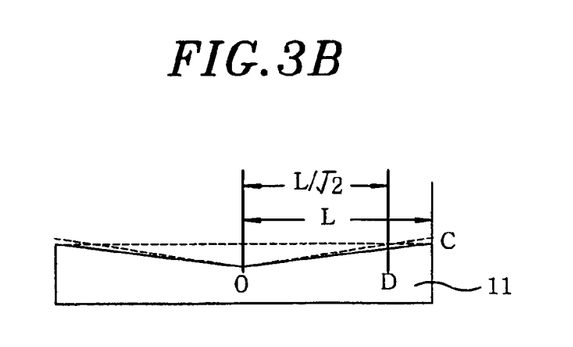
Figure 3C:
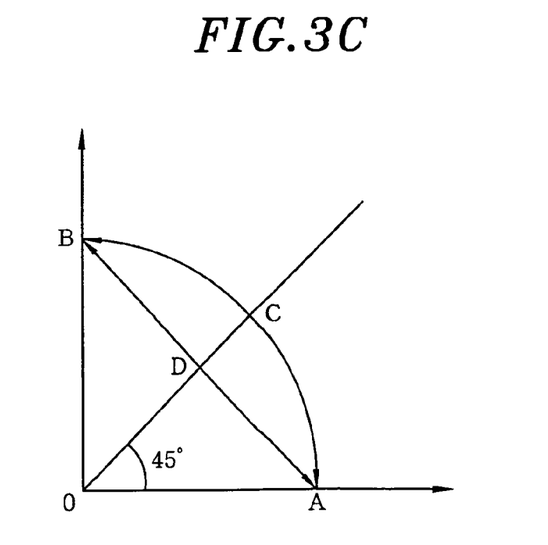

FIGS. 3A to 3C show a comparison between the conical model of this embodiment and the conventional planar model. Specifically, FIG. 3A is a cross sectional view of the chuck top 11 taken along a straight line OA; FIG. 3B is a cross sectional view of the chuck top 11 taken along a straight line shifted by 45O from the straight line OA; and FIG. 3C is a top view of the chuck top 11 shown in FIG. 3B.

Since the straight lines OA and OB perpendicular to each other on the chuck top 11 are obtained based on the measurement values, they are the same both in the conical model and the planar model. However, a height of a position located between the straight lines OA and OB perpendicular to each other is different between the conical model and the planar model. For example, there is considered a intersection point D between the straight line AB connecting the points A and b and a straight line forming 45° with the straight line OA, as shown in FIG. 3C.

In the conical model, the top surface of the chuck top 11 is treated as a cone shape reflecting the actual shape thereof, and the point D on the plane OAB of the chuck top 11 is positioned on a curved line that changes depending on a height of a curved line AB on the chuck top 11 with respect to the origin C. Therefore, all points on an extended line of the straight line OD connecting the points D and the origin C are positioned on the top surface of the chuck top 11. Accordingly, an intersection point C between the extended line of the straight line OD and the arc AB coincides with a height of the chuck top 11, as illustrated in FIG. 3B. In the conical model, even if circumferential position of the chuck top 11 is specified by the computer 17, the height of the chuck top 11 calculated in that position is substantially the same as the actual height of the chuck top 11. That is, the calculated height of the chuck top 11 is substantially the same as the actual height of the chuck top 11 with respect to any circumferential position specified.

Meanwhile, in the conventional planar model, the top surface of the chuck top 11 is treated as a plane and, also, the plane OAB of the chuck top 11 is considered as a uniform plane. Therefore, the straight line OD and OA on the plane OAB do not coincide with the straight line OD and OA on the actual chuck top 11, as shown in FIG. 3B. Accordingly, even if any position in the peripheral portion of the chuck top 11 is specified by the computer 17, the height of the chuck top 11 measured in that position is different from the actual height of the chuck top 11. That is, the height of the chuck top 11 becomes different from the actual height of the chuck top 11 with respect to any position specified in the peripheral portion thereof.

Numerical values in FIG. 3B indicate dimensions from the origin to each point in the case where the length of the straight line OA in FIG. 3C is defined as L.

As set forth above, in accordance with this embodiment, the height of the top surface of the chuck top 11 is calculated by using a conical model reflecting the actual shape, so that the height of the chuck top 11 can be calculated with high precision, compared to the conventional method using a planar model. Therefore, when a semiconductor wafer is inspected, a deviation in the height of the chuck top 11 is small and, hence, a uniform overdrive can be constantly applied to the chuck top 11. As a result, the inspection of high reliability can be carried out.

The present invention is not limited to the above embodiments, and can be properly modified if necessary.

The present invention is suitable for a probe device for performing an inspection of a target object, e.g., a semiconductor wafer or the like.

While the invention has been shown and described with respect to the embodiments, it will be understood by those skilled in the art that various changes and modification may be made without departing from the scope of the invention as defined in the following claims.

What is claimed is:

1. A method for calculating a height of a chuck top, wherein when electrical characteristics of a target object mounted on the chuck top of a probe device are inspected, XY coordinates of at least five points including a center point of a top surface of the chuck top and right, left, upper and lower points thereof are specified by a computer on an XY coordinate plane on the computer; heights of the chuck top which correspond to the specified coordinates are measured sequentially; coordinate transformation formulas for converting the XY coordinates to coordinates including the heights of the top surface of the chuck top are obtained for four quadrants of the XY coordinate plane respectively, and a height of the top surface of the chuck top which correspond to an arbitrary position specified on the XY coordinate plane by the computer is calculated in each of the four quadrants based on the coordinate transformation formulas, the method comprising:

setting, by using the computer, a conical model in which two adjacent points other than the center point of the chuck top which correspond to the specified coordinates in a predetermined quadrant of the XY coordinate plane are obtained on a circumference having the center point of the chuck top as the origin; and specifying an arbitrary point in the predetermined quadrant by using the computer and calculating a height of the arbitrary point of the chuck top based on the conical model, the coordinate transformation formulas and the specified coordinates.

2. A method for calculating a height of a chuck top, wherein when electrical characteristics of a target object mounted on the chuck top of a probe device are inspected, XY coordinates of at least five points including a center point of a top surface of the chuck top and right, left, upper and lower points thereof are specified by a computer on an XY coordinate plane on the computer; heights of the chuck top which correspond to the specified coordinates are measured sequentially; coordinate transformation formulas for converting the XY coordinates to coordinates including the heights of the top surface of the chuck top are obtained for four quadrants of the XY coordinate plane respectively, and a height of the top surface of the chuck top which correspond to an arbitrary position specified on the XY coordinate plane by the computer is calculated in each of the four quadrants based on the coordinate transformation formulas, the method comprising:

setting, by using the computer, a conical model in which two adjacent points other than the center point of the chuck top which correspond to the specified coordinates in a predetermined quadrant of the XY coordinate plane are obtained on a circumference having the center point as the origin;

specifying, by using the computer, an arbitrary point of the chuck top in the predetermined quadrant of the XY coordinate plane;

calculating, by using the computer, X and Y coordinates on X and Y axis of the XY coordinate plane by rotating specified coordinates of the arbitrary point along the circumference;

calculating, by using the computer, a height of the chuck top with respect to the X and Y coordinates based on the X and Y coordinates corresponding to the specified coordinates of the arbitrary point and the coordinate transformation formulas;

calculating, by using the computer, a central angle formed by one of the two adjacent points and the arbitrary point relative to the center point of the chuck top; and calculating, by using the computer, a height of the arbitrary point based on a difference in heights of the two adjacent points and a ratio of the central angle to an angle formed by the X and Y axis.

3. The method of claim 1, wherein the coordinate transformation formulas include X=ax+by, Y=cx+dy and Z=eX+fY, and coefficient of the coordinate transformation formulas are calculated based on specified coordinates of the three points in the predetermined quadrant and three points of the conical model which correspond to the specified coordinates.

4. The method of claim 2, wherein the coordinate transformation formulas include X=ax+by, Y=cx+dy and Z=eX+fY, and coefficient of the coordinate transformation formulas are calculated based on specified coordinates of the three points in the predetermined quadrant and three points of the conical model which correspond to the specified coordinates.

5. A storage medium storing as a program a method for calculating a height of a chuck top, wherein when electrical characteristics of a target object mounted on the chuck top of a probe device are inspected, XY coordinates of at least five points including a center point of a top surface of the chuck top and right, left, upper and lower points thereof are specified by a computer on an XY coordinate plane on the computer; heights of the chuck top which correspond to the specified coordinates are measured sequentially; coordinate transformation formulas for converting the XY coordinates to coordinates including the heights of the top surface of the chuck top are obtained for four quadrants of the XY coordinate plane respectively, and a height of the top surface of the chuck top which correspond to an arbitrary position specified on the XY coordinate plane by the computer is calculated in each of the four quadrants based on the coordinate transformation formulas, wherein the program drives the computer to set a conical model in which two adjacent points other than the center point of the chuck top which correspond to the specified coordinates in a predetermined quadrant of the XY coordinate plane are obtained on a circumference having the center point of the chuck top as the origin; and to specify an arbitrary point in the predetermined quadrant and calculate a height of the arbitrary point of the chuck top based on the conical model, the coordinate transformation formulas and the specified coordinates.

6. A storage medium storing as a program a method for calculating a height of a chuck top, wherein when electrical characteristics of a target object mounted on the chuck top of a probe device are inspected, XY coordinates of at least five points including a center point of a top surface of the chuck top and right, left, upper and lower points thereof are specified by a computer on an XY coordinate plane on the computer; heights of the chuck top which correspond to the specified coordinates are measured sequentially; coordinate transformation formulas for converting the XY coordinates to coordinates including the heights of the top surface of the chuck top are obtained for four quadrants of the XY coordinate plane respectively, and a height of the top surface of the chuck top which correspond to an arbitrary position specified on the XY coordinate plane by the computer is calculated in each of the four quadrants based on the coordinate transformation formulas, wherein the program drives the computer to set a conical model in which two adjacent points other than the center point of the chuck top which correspond to the specified coordinates in a predetermined quadrant of the XY coordinate plane are obtained on a circumference having the center point of the chuck top as the origin;

to specify an arbitrary point of the chuck top in the predetermined quadrant of the XY coordinate plane;

to calculate X and Y coordinates on X and Y axis of the XY coordinate plane by rotating specified coordinates of the arbitrary point along the circumference;

to calculate a height of the chuck top with respect to the X and Y coordinates based on the X and Y coordinates corresponding to the specified coordinates of the arbitrary point and the coordinate transformation formulas;

to calculate a central angle formed by one of the two adjacent points and the arbitrary one point relative to the center point of the chuck top; and to calculate a height of the arbitrary point based on a difference in heights of the two adjacent points and a ratio of the central angle to an angle formed by the X and Y axis.

7. The program storage medium of claim 6, wherein the coordinate transformation formulas include X=ax+by, Y=cx+dy and Z=eX+fY, and coefficient of the coordinate transformation formulas are calculated based on specified coordinates of the three points in the predetermined quadrant and three points of the conical model which correspond to the specified coordinates.

8. The program storage medium of claim 5, wherein the coordinate transformation formulas include X=ax+by, Y=cx+dy and Z=eX+fY, and coefficient of the coordinate transformation formulas are calculated based on specified coordinates of the three points in the predetermined quadrant and three points of the conical model which correspond to the specified coordinates.

* * * * *